United States Patent
Bogner et al.

(10) Patent No.: US 7,586,190 B2
(45) Date of Patent: Sep. 8, 2009

(54) OPTOELECTRONIC COMPONENT AND A MODULE BASED THEREON

(75) Inventors: Georg Bogner, Lappersdorf (DE); Patrick Kromotis, Regensburg (DE); Ralf Mayer, Bolanden (DE); Heinrich Noll, Gross-Umstadt (DE); Matthias Winter, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 10/529,626

(22) PCT Filed: Sep. 29, 2003

(86) PCT No.: PCT/DE03/03240

§ 371 (c)(1),
(2), (4) Date: Nov. 23, 2005

(87) PCT Pub. No.: WO2004/032249

PCT Pub. Date: Apr. 15, 2004

(65) Prior Publication Data

US 2006/0138621 A1    Jun. 29, 2006

(30) Foreign Application Priority Data

Sep. 30, 2002  (DE) ................ 102 45 930

(51) Int. Cl.
*H01L 23/34* (2006.01)
(52) U.S. Cl. .............. 257/717; 257/100; 257/E23.181
(58) Field of Classification Search ............. 257/79, 257/82, 100, 92, 717, E23.181
See application file for complete search history.

(56) References Cited

U.S. PATENT DOCUMENTS

| | | | |
|---|---|---|---|
| 5,245,620 A | | 9/1993 | Tanaka et al. |
| 6,095,666 A | * | 8/2000 | Salam ..................... 362/310 |
| 6,318,886 B1 | * | 11/2001 | Stopa et al. ............... 362/555 |
| 6,340,824 B1 | * | 1/2002 | Komoto et al. ............ 257/99 |
| 6,498,355 B1 | * | 12/2002 | Harrah et al. ............. 257/99 |
| 6,800,930 B2 | * | 10/2004 | Jackson et al. ........... 257/700 |
| 6,860,621 B2 | * | 3/2005 | Bachl et al. .............. 362/373 |
| 6,862,304 B2 | | 3/2005 | Maurer et al. |
| 6,900,511 B2 | * | 5/2005 | Ruhnau et al. ........... 257/432 |
| 2003/0178627 A1 | | 9/2003 | Marchl et al. |

FOREIGN PATENT DOCUMENTS

| | | |
|---|---|---|
| CN | 2074504 | 4/1991 |
| DE | 100 51 159 | 5/2002 |
| DE | 102 46 892 | 4/2003 |

(Continued)

*Primary Examiner*—Chuong A Luu
*Assistant Examiner*—A. K. A.
(74) *Attorney, Agent, or Firm*—Cohen Pontani Lieberman & Pavane LLP

(57) ABSTRACT

An optoelectronic component (1) having a semiconductor arrangement (4) which emits and/or receives electromagnetic radiation and which is arranged on a carrier (22) which is thermally conductively connected to a heat sink (12). External electrical connections (9) are connected to the semiconductor arrangement (4), where the external electrical connections (9) are arranged in electrically insulated fashion on the heat sink (12) at a distance from the carrier (22). This results in an optimized component in terms of the dissipation of heat loss and the radiation of light and also in terms of making electrical contact and the packing density in modules.

21 Claims, 1 Drawing Sheet

FOREIGN PATENT DOCUMENTS

| | | |
|---|---|---|
| EP | 1 139 019 | 10/2001 |
| EP | 1 139 439 | 10/2001 |
| EP | 1 174 930 | 1/2002 |
| EP | 1 182 757 | 2/2002 |
| JP | 59 094361 | 5/1984 |
| JP | 11-284234 | 10/1999 |
| JP | 2000-216434 | 8/2000 |
| JP | 2002-9347 | 1/2002 |
| JP | 2002-33517 | 1/2002 |
| JP | 2002 270901 | 9/2002 |
| WO | WO 02/33756 | 4/2002 |

* cited by examiner

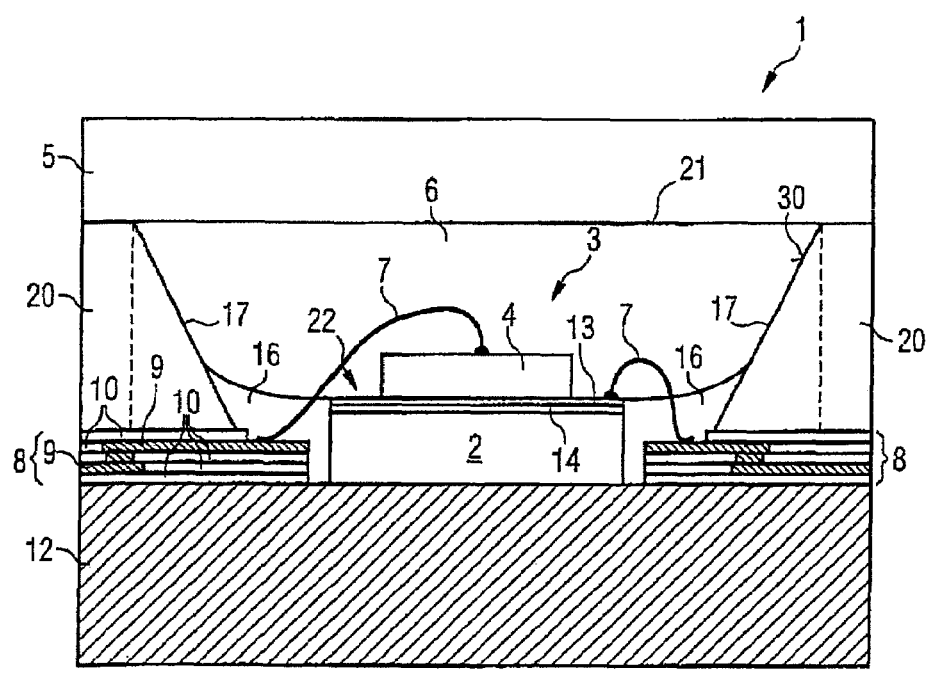

OPTOELECTRONIC COMPONENT AND A MODULE BASED THEREON

RELATED APPLICATIONS

This is a U.S. national stage of application No. PCT/DE2003/003240, filed on 29 Sep. 2003.

This patent application claims the priority of German patent application no. 102 45 930.4, filed 30 Sep. 2002, the disclosure content of which is hereby incorporated by reference.

FIELD OF THE INVENTION

The present invention relates to an optoelectronic component arrangement which allows adjacent components to be in closer proximity to each other.

The present invention relates to an optoelectronic component in accordance with the precharacterizing part of patent claim 1 and to a component-based module in accordance with the precharacterizing part of claim 17.

BACKGROUND OF THE INVENTION

In the following discussion, terms will be used having these definitions. A "semiconductor arrangement" is a stack of semiconductor layers (including an active optical layer) grown on a substrate. This is designated on the drawing by reference numeral 4. A "semiconductor component" includes a carrier substrate (designated by reference numeral 2 in the drawing), isolating/connecting layers (13/14), a semiconductor arrangement (4), and electrical connections, such as bonding wires (7) to the semiconductor arrangement. A "semiconductor chip" includes a carrier (2), the isolating/connecting layers (13/14), and the semiconductor arrangement (4). A "module" is an arrangement of semiconductor components.

Radiation-emitting semiconductor components can be arranged in a matrix in order to attain a high-intensity overall module.

An arrangement of this type, referred to as an LED module, is known from co-pending U.S. patent application Ser. No. 10/414,739. In this case, a plurality of optoelectronic semiconductor arrangements or semiconductor chips are mounted on a carrier which is in turn arranged on a heat sink. Despite the increasing packing density of the semiconductor components, it is possible to dissipate the heat produced. In this case, the heat produced must not affect the electrical behavior of the semiconductor component, however, or must affect it only insignificantly. This practice reduces the efficiency of the overall module on account of the absorption of the radiation from adjacent semiconductor components, however.

By placing the individual radiation-emitting semiconductor components in a reflector, it is possible to improve the module's radiation and directional characteristics, since at least some of the radiation emitted at the side of the individual semiconductor components is reflected into the primary radiation direction.

A module with a high level of efficiency and very good directional characteristics can be assembled from individual semiconductor components which are each situated in an individual reflector. In this context, however, it is difficult to obtain a high packing density for the semiconductor components together with the reflector in the overall module. The contact-connections between the semiconductor components stand in the way of flexible connection and a high packing density.

SUMMARY OF THE INVENTION

The present invention is therefore based on the object of providing an optoelectronic component and a component-based module which allow adjacent semiconductor components or optoelectronic semiconductor arrangements to be in close arrangement.

In particular, the object is based on providing a semiconductor component having a contact-connection arrangement which allows the conduction of heat to be isolated from the conduction of electricity.

The invention provides an optoelectronic component having a semiconductor arrangement which emits and/or receives electromagnetic radiation and which is arranged on a carrier which is thermally conductively connected to a heat sink. Bonding wires connect the external electrical connections to the connections of the semiconductor arrangement. The external electrical connections are arranged in electrically insulated fashion on the heat sink at a distance from the carrier.

This has the advantage that the electrical conductive connections are largely decoupled from the conduction of heat. The thermal connection of a semiconductor arrangement or chip on the heat sink by means of the carrier allows a large number of chips to be arranged closely on the heat sink and allows the heat to be dissipated. The electrical contact-connection between the chips can be made flexibly using the connections insulated from the heat sink. In addition, compact reflective housings can be fitted on the external electrical connections, which reduces the space requirement for the component and allows high luminous efficiency.

This practice has the advantage that the flow of electric current does not pass through the heat sink, which dissipates the heat produced during operation of the semiconductor component.

It is advantageous if the carrier includes a carrier substrate and at least one electrically insulating layer arranged thereon. Alternatively, the carrier material itself is an electrical insulation. In that case, the semiconductor arrangement does not need to be insulated from the carrier separately and may be arranged on a conductive substrate without producing a short circuit between them or with the heat sink.

The semiconductor arrangement and the electrically insulating layer may have an electrically conductive layer arranged between them which is connected to an external electrical connection. This is expedient particularly for a semiconductor arrangement on a conductive substrate, because it is possible to route a connection for the semiconductor arrangement by means of a bonding wire via the electrically conductive layer.

It is particularly advantageous if the external electrical connections include conductor tracks on a printed circuit board. The printed circuit board contains an insulating substrate with a conductor track and can therefore be mounted directly on the heat sink. It is also possible for a plurality of printed circuit boards to be arranged above one another, these then also being insulated from one another.

Conductor tracks which can be connected to one another by means of plated-through holes on different printed circuit boards arranged above one another further increase the flexibility of the connection of a large number of optoelectronic components.

Provision is advantageously made for the carrier substrate to have at least one material with good thermal conductivity from the group comprising Si, diamond-coated Si, diamond, SiC, AlN and BN.

It is also advantageous if the electrically insulating layer comprises $SiO_2$. This is particularly advantageously the case when the carrier layer comprises silicon.

In a large number of components, these materials used in semiconductor technology reduce the strain among one another and with respect to the semiconductor chips themselves.

In one advantageous embodiment, the semiconductor arrangement is attached to the carrier by means of a metal solder or a thermally and/or electrically conductive adhesive.

Good thermal conduction or dissipation of heat is obtained if the carrier is attached to the heat sink by means of a metal solder or a thermally conductive adhesive.

Very good radiation of light becomes possible if the semiconductor arrangement and the carrier are arranged in a basic housing which has reflective properties.

The radiation of light can be adapted to the chip very well and individually if the basic housing contains precisely one semiconductor arrangement. In that case, the light efficiency of the semiconductor component does not decrease on account of absorption of an adjacent semiconductor arrangement within the cavity.

The optoelectronic component based on the invention has a cavity or cutout in the basic housing which (cavity or cutout) contains the semiconductor arrangement which emits and/or receives electromagnetic radiation. Unlike in conventional optoelectronic components, the reflector is at least produced not just by reflective lateral faces of the cavity in the basic housing itself, but rather at least partly by a reflective filling compound which the cavity contains. For this, the material and the quantity of filling compound are chosen such that, during and/or after filling, the adhesive force between the material of the filling compound and the material of the lateral faces of the cavity causes the filling compound to rise up on these lateral faces and form a curved surface. This filling compound surface facing the front of the housing serves as a reflective area for electromagnetic radiation emitted and/or received by the semiconductor arrangement.

In other words, the cavity is partly filled with the filling compound, and the adhesive force between the filling compound and the basic housing causes the filling compound to form a curved surface in the cavity automatically, since the filling compound rises up on the lateral internal faces of the cavity of the basic housing. The filling compound's curved internal faces formed in this manner form the reflector for the semiconductor arrangement inserted into the cavity.

Even with a very small width of the openings, these reflective areas can easily be produced in the cavity through suitable dosage of the filling compound. As a result, the lateral walls of the housing and the filling compound behave like a single reflector, which further improves the light radiation power. In addition, the conductor tracks, wires and the like which the cavity contains are enveloped by the filling compound without impairing the manner of operation thereof.

Hence, even in the case of optoelectronic components with a very small width of the openings and/or complex semiconductor arrangement and wiring arrangements in the cavity, the inventive measure can be used to provide reflectors within the cavity and hence to increase the light efficiency of the components.

Hence, even in the case of optoelectronic components with narrow openings in the cavity and/or complex semiconductor arrangement and wiring arrangements in the cavity, the inventive measure can be used to provide reflectors within the cavity and hence to increase the light efficiency of the components.

It is particularly advantageous if the basic housing is formed at an angle on the inner side which faces the semiconductor arrangement, so that the basic housing has a reflective area for a portion of the radiation emitted by the semiconductor arrangement.

The filling compound provided is preferably $TiO_2$, or an epoxy resin filled with $TiO_2$ particles, or silicone.

In addition, the cavity of the housing is at least partly filled with a radiation-pervious encapsulation compound. This firstly makes it possible to protect the chip and its connections. In addition, with appropriate choice of chip and of encapsulation compound, it is possible to produce components in different colors. By way of example, white-radiating components using a GaN-based chip and an encapsulation compound which contains YAG:Ce particles.

This encapsulation compound may advantageously contain epoxy resin or silicone. When using silicone, mechanical stresses in the semiconductor component or in a module comprising individual semiconductor components can be reduced to a high extent.

Preferably, at least some of the external connections are arranged between the basic housing and the heat sink. This allows the optoelectronic components to be connected in a particularly space-saving manner.

Preferably, the invention uses high-power chips as semiconductor arrangement. In this context, the component is provided for an electrical power consumption of at least 0.5 W. In a further advantageous variant, the component is provided for an electrical power consumption of at least 1 W. In a particularly advantageous variant, the component is provided for an electrical power consumption of at least 3 W.

On account of the conduction of heat and electricity being decoupled, the invention also requires an advantageously small amount of space, with the base area of the component preferably being less than or equal to 1 $cm^2$, even when high-power chips are used.

With particular advantage, the scope of the invention allows the plurality of inventive optoelectronic components to be arranged to form a module. In a module of this type, the optoelectronic components are preferably arranged in the form of a matrix and at least some of them are connected in series.

For a plurality of optoelectronic components, a respective basic housing is provided in this case.

In one particularly preferred embodiment of the invention, the carrier's topmost layer facing the semiconductor arrangement is electrically conductive. Preferably, this electrically conductive layer essentially comprises a metal.

At least some of the optoelectronic components are preferably electrically conductively connected to one another by conductor tracks, some of which may be arranged between the basic housing and the heat sink, in particular. The conductor tracks for connecting the semiconductor chips allow the optoelectronic components to be connected to an adjacent component in a highly space-saving manner. No bonding wire is routed via the edge of the basic housing. The conductor tracks allow components to be connected in complex fashion. The conductor tracks may be situated in a printed circuit board (e.g. FR4, flexible printed circuit board) which has appropriate cutouts. The printed circuit board may be in multilayer form, which means that in addition to conductor tracks further functional elements may be present in a multilayer structure.

BRIEF DESCRIPTION OF THE SINGLE DRAWING

The FIGURE shows a schematic illustration of a sectional view of the exemplary embodiment.

DETAILED DESCRIPTION OF THE SINGLE DRAWING

In the case of the optoelectronic component 1 shown in the FIGURE, a semiconductor arrangement 4 emitting and/or receiving electromagnetic radiation is arranged on a carrier 22. The carrier 22 is thermally conductively connected to a heat sink 12 made of copper, aluminum or molybdenum, for example. External electrical connections 9 are electrically connected to the semiconductor arrangement 4 or to an electrically conductive layer 13 via bonding wires 7. The electrically conductive layer 13 makes contact with the underside of the semiconductor arrangement 4, which is constructed such that a current can flow vertically through the arrangement, e.g. by virtue of the substrate being conductive for the active layer which produces the light. Thus, electric contacts need to be provided on the upper and lower surfaces on the semiconductor arrangement.

In another embodiment with an insulating substrate for the active layer, a current can flow only in a lateral direction through the semiconductor layers. In this case, electrical contacts and both bonding wires are on the upper surface of the semiconductor arrangement.

In the FIGURE, the electrically conductive layer 13 is insulated from the carrier substrate 2 of the carrier 22 by means of an electrically insulating layer 14. The electrically insulating layer 14 may preferably have two layers and be made of silicon oxide and a passivation layer applied above that, e.g. made of silicon nitride, which electrically isolates the carrier substrate, which has good thermal conductivity and is preferably made of silicon or of gallium arsenide, from the electrically conductive layer 13. Ceramic-type materials with good thermal conductivity, such as aluminum nitride or boron nitride or carbides, are also suitable as carrier substrate. The carrier 22 is mounted directly on a heat sink 12 made of aluminum, copper or molybdenum by means of a solder connection or an adhesive bond. With an electrical power consumption by the component of at least 0.5 W and a base area for the component of no more than 1 cm$^2$, the heat produced can be effectively dissipated from the component when the flows of heat and current are isolated as described. In another embodiment, a power consumption by the component of at least 1 W or even at least 3 W is provided.

Likewise directly on the heat sink 12, external electrical connections 9 are arranged in electrically insulated fashion and at a distance from the carrier 22. The external electrical connections 9 are preferably conductor tracks from printed circuit boards 10 which are arranged above one another and which form the connection arrangement 8. The two chip connections require at least one printed circuit board in that one printed board can have two different conductor tracks, each track connecting one chip connection. A plurality of chips in a module are preferably connected by multilayer printed circuit boards which allow flexible connection, for example series connection of components arranged in the form of a matrix. Different conductor tracks on various printed circuit boards are connected by means of plated-through holes respectively between the basic housing 20 and the heat sink 12 of an optoelectronic component.

The semiconductor arrangement 4 with the carrier 22 is situated in a basic housing 20 with a cutout or cavity 3. The basic housing may be a frame which is mounted on the printed circuit boards 10 with the electrical connections 9. This allows a very compact design for the inventive component 1. This also allows the inner side 17 of the basic housing 20 to be in the form of a reflector 30 in order to output as much and as directional light as possible from the component.

The semiconductor chip 4 and the lateral walls 17 of the cavity 3 have a filling between them which comprises a reflective filling compound 16 which, by way of example, is made of epoxy resin filled with TiO$_2$ particles, the proportion of TiO$_2$ in the filling compound 16 being sufficient to increase the reflective power of the filling compound to a significant extent. The filling compound extends on the chip side to approximately the top edge of the carrier 22. Preferably, the proportion of TiO$_2$ in the filling compound 16 is between approximately 10 and 50% by volume. Particles comprising zirconium dioxide, zinc oxide, barium sulfate, gallium nitride, aluminum oxide or a mixture of at least two of these are also suitable for use with an epoxy resin in the filling compound 16.

What is important is that the difference in reflective index between the epoxy resin and the particles is sufficiently great for the reflectivity of the filling compound to rise.

As seen from the semiconductor chip 4, the filling compound surface which faces the front 21 of the basic housing 20 is curved and forms a reflective area at least for a portion of the radiation emitted and/or received at the side.

The free surface region of the semiconductor chip 4 which is situated above the filling compound is covered by a radiation-pervious encapsulation compound 6 and, by way of example, is in turn made of an epoxy resin or other suitable reaction resin.

As can be seen in the sectional view of the FIGURE, the filling level of the filling compound 16 is low adjacent to the semiconductor chip 4, i.e. adjacent to the carrier 22. This means that the curved shape of the surface of the filling compound 16 opens essentially toward the front in conjunction with the surface 30 of the lateral wall of the housing 20. With a suitable choice of material and of dosage for the filling compound, this shape is obtained automatically on account of the adhesive forces between the filling compound and the material of the housing frame 20. The curved inner faces of the filling compound 16 (as seen from the semiconductor chips 4) serve as reflector for the radiation which is emitted and/or received by the semiconductor chips 4 at the side.

The reflective power of the filling compound 16 with the TiO$_2$ proportion it contains is up to approximately 80%. In comparison with an optoelectronic component in which the cavity is filled exclusively with a transparent filling compound, the optoelectronic component 1 of the present invention was able to be used to increase the external efficiency considerably.

To protect the semiconductor chips 4, the cavity 3 is filled entirely with a radiation-pervious, for example transparent, encapsulation compound 6 which envelops the semiconductor chip 4 and which is pervious to radiation for emission or reception by the semiconductor chips 4. As in the conventional components, suitable filling compounds made of transparent artificial resins, such as epoxy resin, or made of polycarbonate may be used for this encapsulation compound 6, which is preferably particularly in tune with the properties of the filling compound. A cap 5 covers the encapsulation compound 6 and the front of the basic housin 20.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. An optoelectronic component comprising:
a heat sink;
a carrier thermally conductively connected to the heat sink;
a semiconductor arrangement which emits or receives electromagnetic radiation and which is arranged on the carrier;
external electrical connections which are connected to the semiconductor arrangement, wherein the external electrical connections are arranged in electrically insulated fashion on the heat sink at a distance from the carrier;
a basic housing arranged on the heat sink,
wherein the semiconductor arrangement and the carrier are arranged in a cavity defined in the basic housing, and wherein the cavity in the basic housing comprises an inner side which obliquely faces the semiconductor arrangement and forms a first reflective area for a portion of the electromagnetic radiation; and
a reflective filling compound provided between the semiconductor arrangement and the inner side of the basic housing, the reflective filling material comprising a concave curved surface extending from the inner side of the basic housing to a top edge of the carrier and forming a second reflective area for another portion of the electromagnetic radiation.

2. The optoelectronic component as claimed in claim 1, wherein the carrier contains a carrier substrate and an electrically insulating layer arranged thereon.

3. The optoelectronic component as claimed in claim 2, wherein the semiconductor arrangement and the electrically insulating layer have an electrically conductive layer arranged therebetween which is connected to one of the external electrical connections.

4. The optoelectronic component as claimed in claim 1, wherein the semiconductor arrangement contains a semiconductor chip.

5. The optoelectronic component as claimed in claim 1, wherein the external electrical connections include conductor tracks on a printed circuit board.

6. The optoelectronic component as claimed in claim 1, wherein conductor tracks on different printed circuit boards arranged above one another form the electrical connection and are connected to one another by plated-through holes defined in the printed circuit boards.

7. The optoelectronic component as claimed in claim 2, wherein the carrier substrate has at least one material with good thermal conductivity from the group comprising Si, diamond-coated Si, diamond, SiC, AlN and BN.

8. The optoelectronic component as claimed in claim 2, wherein the electrically insulating layer comprises $SiO_2$.

9. The optoelectronic component as claimed in claim 1, wherein the semiconductor arrangement is attached to the carrier by a metal solder or a thermally or electrically conductive adhesive.

10. The optoelectronic component as claimed in claim 1, wherein the carrier is attached to the heat sink by a metal solder or a thermally conductive adhesive.

11. The optoelectronic component as claimed in claim 1, wherein the cavity of the basic housing contains only one semiconductor arrangement.

12. The optoelectronic component as claimed in claim 1, wherein the filling compound contains $TiO_2$ or an epoxy resin filled with $TiO_2$ particles.

13. The optoelectronic component as claimed in claim 1, wherein the semiconductor arrangement is at least partly encapsulated by a radiation-pervious encapsulation compound.

14. The optoelectronic component as claimed in claim 1, wherein at least some of the external connections are arranged between the basic housing and the heat sink.

15. The optoelectronic component as claimed in claim 1, wherein an electrical power consumption of the optoelectronic component is at least 0.5 W.

16. The optoelectronic component as claimed in claim 1, wherein an electrical power consumption of the optoelectronic component is at least 1 W.

17. The optoelectronic component as claimed in claim 1, wherein an electrical power consumption of the optoelectronic component is at least 3 W.

18. The optoelectronic component as claimed in claim 1, wherein the optoelectronic component has a base area not greater than 1 $cm^2$.

19. A component-based module, wherein the module has a plurality of optoelectronic components as claimed in claim 1.

20. A component-based module having a plurality of optoelectronic components as claimed in claim 1, wherein at least some of the optoelectronic components are electrically conductively connected to one another by conductor tracks.

21. The component-based module as claimed in claim 19, wherein the optoelectronic components are arranged in the form of a matrix and at least some of the optoelectronic components are connected in series.

* * * * *